(12) United States Patent
Stebani et al.

(10) Patent No.: US 8,066,837 B2
(45) Date of Patent: Nov. 29, 2011

(54) PROCESSES AND APPARATUS FOR PRODUCING PHOTOPOLYMERIZABLE, CYLINDRICAL, CONTINUOUS, SEAMLESS FLEXOGRAPHIC PRINTING ELEMENTS

(75) Inventors: Uwe Stebani, Flösheim-Dalsheim (DE); Uwe Krauss, Gosserweiler-Stein (DE); Udo Metzmann, Obrigheim (DE); Inge Raschke-Metzmann, legal representative, Obrigheim (DE)

(73) Assignee: Flint Group Germany GmbH (DE)

( * ) Notice: Subject to any disclaimer, the term of this patent is extended or adjusted under 35 U.S.C. 154(b) by 700 days.

(21) Appl. No.: 11/665,482

(22) PCT Filed: Oct. 12, 2005

(86) PCT No.: PCT/EP2005/010959
§ 371 (c)(1),
(2), (4) Date: Jul. 28, 2008

(87) PCT Pub. No.: WO2006/042676
PCT Pub. Date: Apr. 27, 2006

(65) Prior Publication Data
US 2009/0173435 A1    Jul. 9, 2009

(30) Foreign Application Priority Data
Oct. 14, 2004 (DE) .......... 10 2004 050 277

(51) Int. Cl.
*B29C 63/10* (2006.01)
*B29C 65/02* (2006.01)
*B29C 65/18* (2006.01)
*B65H 81/00* (2006.01)
*B32B 37/02* (2006.01)
*B32B 38/10* (2006.01)
*B32B 43/00* (2006.01)

(52) U.S. Cl. ........ 156/187; 156/191; 156/247; 156/258; 156/266; 156/267; 430/300; 430/302; 430/306; 430/307

(58) Field of Classification Search ........ 156/187, 156/189, 191, 194, 195, 244.11, 244.13, 156/244.24, 244.27, 247, 250, 258, 266, 156/267, 446, 448–450, 425, 429; 430/306, 430/307, 302, 300, 327; 493/337, 338, 395; 433/337, 338, 395
See application file for complete search history.

(56) References Cited

U.S. PATENT DOCUMENTS

| | | | |
|---|---|---|---|
| 3,264,103 A | | 8/1966 | Cohen et al. |
| 4,427,759 A | | 1/1984 | Gruetzmacher et al. |
| 4,539,287 A | | 9/1985 | Grossa et al. |
| 4,710,536 A | * | 12/1987 | Klingen et al. ............ 524/493 |
| 4,758,500 A | | 7/1988 | Schober et al. |
| 4,869,997 A | | 9/1989 | Koch et al. |
| 4,871,650 A | * | 10/1989 | Wallbillich et al. ........ 430/300 |
| 4,883,742 A | * | 11/1989 | Wallbillitch et al. ...... 430/275.1 |
| 5,175,072 A | | 12/1992 | Martens |
| 5,176,986 A | | 1/1993 | Telser et al. |
| 5,262,275 A | | 11/1993 | Fan |
| 5,759,742 A | | 6/1998 | West et al. |
| 5,916,403 A | * | 6/1999 | Cushner et al. ......... 156/244.13 |
| 6,171,758 B1 | | 1/2001 | Bhateja et al. |
| 6,250,048 B1 | * | 6/2001 | Linkiewicz .................... 53/451 |
| 6,358,668 B1 | | 3/2002 | Leenders et al. |
| 6,521,390 B1 | | 2/2003 | Leinenbach et al. |
| 6,653,046 B2 | | 11/2003 | Kozaki et al. |
| 6,698,354 B2 | | 3/2004 | Juffinger et al. |
| 6,857,365 B2 | | 2/2005 | Juffinger et al. |
| 6,935,236 B2 | | 8/2005 | Hiller et al. |
| 7,101,653 B2 | | 9/2006 | Kaczun et al. |
| 7,105,206 B1 | | 9/2006 | Beck et al. |
| 2001/0012599 A1 | | 8/2001 | Michels et al. |
| 2006/0249239 A1 | | 11/2006 | Krauss et al. |

FOREIGN PATENT DOCUMENTS

| | | |
|---|---|---|
| CA | 1329505 C | 5/1994 |
| DE | 27 22 896 A1 | 11/1978 |
| DE | 29 11 908 A1 | 10/1979 |
| DE | 31 25 564 A1 | 1/1983 |
| DE | 37 04 694 | 8/1988 |
| DE | 299 02 160 | 5/1999 |
| DE | 103 18 042 A1 | 11/2004 |
| EP | 0 084 851 | 8/1983 |

| | | |
|---|---|---|
| EP | 0 231 902 A2 | 8/1987 |
| EP | 0 463 016 | 2/1992 |
| EP | 0 469 375 A2 | 2/1992 |
| EP | 0 654 150 | 5/1995 |
| EP | 0 766 142 | 4/1997 |
| EP | 1 069 475 | 1/2001 |
| EP | 1 070 989 | 1/2001 |
| EP | 1 072 953 | 1/2001 |
| EP | 1 170 343 A1 | 1/2002 |
| EP | 1 262 315 | 12/2002 |
| EP | 1 262 316 | 12/2002 |
| GB | 2 017 570 A | 10/1979 |
| GB | 1 579 817 | 11/1980 |
| JP | 2001-290384 A | 10/2001 |
| WO | WO-90/11344 | 10/1990 |
| WO | WO-96/14603 | 5/1996 |
| WO | WO-01/39897 | 6/2001 |
| WO | WO-01/88615 | 11/2001 |
| WO | WO-02/76739 | 10/2002 |
| WO | WO-02/83418 | 10/2002 |

* cited by examiner

*Primary Examiner* — Philip Tucker
*Assistant Examiner* — Sing P Chan
(74) *Attorney, Agent, or Firm* — Connolly Bove Lodge & Hutz LLP

(57) ABSTRACT

Processes comprising providing a layer composite comprising a layer of photopolymerizable material and a removable substrate film disposed on one side of the layer of photopolymerizable material, wherein the photopolymerizable material comprises an elastomeric binder, an ethylenically unsaturated monomer and a photoinitiator; and (a) miter-cutting two edges of the layer composite to be joined, to form two miter-cut ends; (b) providing a hollow cylinder on a rotatably mounted support cylinder, wherein the hollow cylinder has an outer surface and is in a temporarily locked position relative to the support cylinder; (c) applying an adhesion-promoting layer to the outer surface of the hollow cylinder; (d) applying the layer composite to the hollow cylinder bearing the adhesive-promoting layer, wherein the layer composite is disposed on the hollow cylinder such that the removable substrate film faces away from the hollow cylinder and the two miter-cut ends lie substantially one on top of the other, but not overlapping; (e) removing the substrate film from the layer of photopolymerizable material to provide an exposed surface of the layer of photopolymerizable material; (f) contacting the exposed surface of the layer of photopolymerizable material with a rotating calender roll with heating to join the two miter-cut edges and form a processed hollow cylinder, wherein heating comprises a locally-acting heat source moved in an axial direction relative to the hollow cylinder along the entire width of the layer of photopolymerizable material such that the exposed surface is heated; and (g) removing the processed hollow cylinder from the support cylinder.

12 Claims, 2 Drawing Sheets

Fig.:2
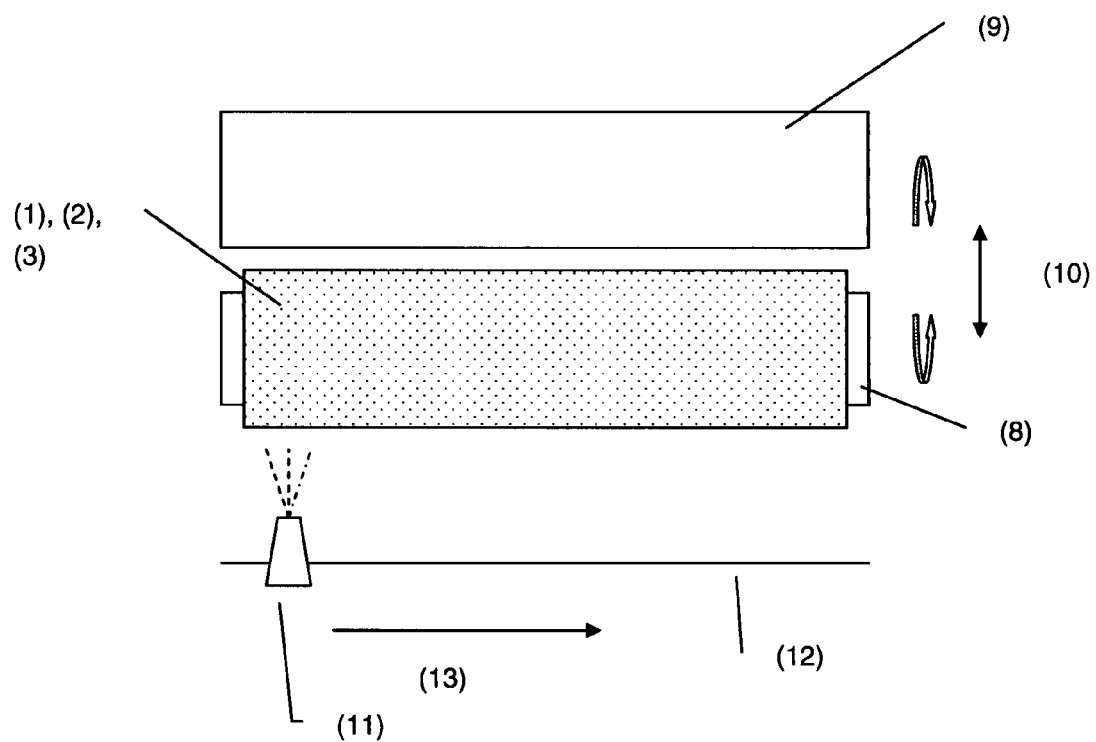

PROCESSES AND APPARATUS FOR PRODUCING PHOTOPOLYMERIZABLE, CYLINDRICAL, CONTINUOUS, SEAMLESS FLEXOGRAPHIC PRINTING ELEMENTS

CROSS-REFERENCE TO RELATED APPLICATIONS

This application is a national stage application, under 35 U.S.C. §371, of PCT/EP2005/010959, filed Oct. 12, 2005, which claims priority of German Application No. 10 2004 050 277.3, filed Oct. 14, 2004.

BACKGROUND OF THE INVENTION

The invention relates to a process for the production of photopolymerizable cylindrical, continuous seamless flexographic printing elements by applying a layer of a photopolymerizable material to the outer surface of a hollow cylinder and joining the edges by calendering. The invention furthermore relates to an apparatus suitable for carrying out the process.

Cylindrical flexographic printing plates are known in principle. In a cylindrical flexographic printing plate, the printing cylinder of the printing press is provided over the whole circumference with a printing layer or a print relief. Cylindrical printing plates are of considerable importance for the printing of continuous patterns and are used, for example, for the printing of wallpapers, decorative papers or gift-wrapping papers.

In principle, the actual printing cylinder of the printing press can itself be provided with a printing layer which completely surrounds it. However, this procedure has the disadvantage that the entire printing cylinder has to be replaced in certain circumstances on changing the printing plate. This is extremely complicated and accordingly expensive.

The use of so-called sleeves is therefore customary. Sleeves comprise a cylindrical hollow body which has been provided with a printing layer or a print relief. The sleeve technique permits very rapid and easy changing of the printing plate. The internal diameter of the sleeves corresponds to the external diameter of the printing cylinder, so that the sleeves can easily be pushed over the printing cylinder of the printing press. Pushing on and moving the sleeves works according to air cushion principle: for the sleeve technology, the printing press is equipped with a special printing cylinder, a so-called air cylinder. The air cylinder has a compressed air connection at the end face, by means of which compressed air can be passed into the interior of the cylinder. From there, it can emerge again via holes arranged on the outside of the cylinder. For mounting a sleeve, compressed air is passed into the air cylinder and emerges again at the outlet holes. The sleeve can now be pushed onto the air cylinder because it expands slightly under the influence of the air cushion, and the air cushion substantially reduces the friction. When the compressed air supply is stopped, the expansion declines and the sleeve fits firmly on the surface of the air cylinder. Further details of the sleeve technique are disclosed, for example, in "Technik des Flexodrucks", page 73 et seq., Coating Verlag, St. Gallen, 1999.

However, high-quality round printing plates cannot be produced by simply surrounding the printing cylinder or a sleeve with a flexographic printing plate processed ready for printing. In fact, a fine gap which always also intersects printing parts of the plate in the case of a true continuous motif remains at the abutting ends of the printing plate. This gap leads to a clearly visible line in the printed image. In order to avoid this line, only nonprinting depressions may be present at this point. Thus, it is not possible to print any desired patterns. Moreover, there is in this technique the danger that the solvent present in the printing ink may penetrate into the gap and may detach the ends of the printing plate from the printing cylinder. This leads to even greater defects in the printed image. Even when the ends are adhesively bonded, clearly visible traces still remain in the printed image.

For the production of high-quality round printing plates, it is therefore necessary to provide the printing cylinder or a sleeve with a completely surrounding, relief-forming, photopolymerizable layer by means of suitable techniques. Only in a second step is the cylindrical photopolymerizable flexographic printing element as such processed to give the final round printing plate. Apparatuses for processing cylindrical flexographic printing elements are commercially available. The application of a continuous seamless, photopolymerizable layer can be effected, for example, by coating from solution or by ring extrusion. However, both techniques are extremely complicated and therefore correspondingly expensive.

In general, maximum precision is important when applying the photopolymerizable layer: modern photopolymerizable flexographic printing elements permit production of flexographic printing plates having substantially higher resolution than was the case in the past. Flexographic printing is therefore also increasingly making inroads into those areas which were previously the preserve of other printing processes. At higher resolution, however, defects in the printing surface of the flexographic printing plate are also more rapidly visible. Differences in thickness in the relief-forming layer have a considerable adverse effect on the true running of the printing cylinder and hence on the print quality. In the case of high-quality flexographic printing plates, the thickness tolerance should usually be not more than ±10 µm.

If the thickness tolerance of the photopolymerizable layer of the sleeve is not sufficient, the surface of the sleeve has to be refinished. DE-A 31 25 564 and EP-A 469 375 disclose processes for improving the print quality, in which the surface of the cylindrical flexographic printing element is first ground and then smoothed with a suitable solvent, and remaining irregularities are, if appropriate, filled with binder or with the material of the photosensitive layer. Such a procedure is of course extremely complicated and tedious. Accordingly, it is therefore absolutely essential to avoid it in an economical process.

There are also known techniques in which a prefabricated, thermoplastically processable layer of photopolymerizable material is wound around the printing cylinder or the sleeve, and the abutting edges of the photopolymerizable layer, also referred to as a seam, are closed as well as possible by means of suitable techniques. It has been proposed, for example by DE 27 22 896, to bond a commercial, sheet-like, photopolymerizable flexographic printing element together with the substrate film adhesively to a printing cylinder or a sleeve so that the cut edges abut one another. The adhesive bonding is preferably effected by means of a double-sided adhesive film. The cut edges are straight and are subsequently welded to one another under pressure and at elevated temperatures. The welding can be effected with the aid of a heated calender roll. The use of a plate having a substrate film is, however, extremely problematic. Typical substrate films have a thickness of from 0.1 to 0.25 mm. If the substrate film does not completely cover the circumference and, owing to a small error in mounting or in cutting to size, leaves even only a minimum gap, the empty space present between the film ends fills with polymeric material during calendering, and an impression of this gap remains on the surface of the photopolymerizable layer and leads to visible defects in the print. It is therefore also necessary as a rule to regrind and smooth such a flexographic printing element.

DE-A 29 11 908 discloses a process in which a photosensitive resin film is wound around a printing cylinder without a substantial distance or a substantial overlap being present between the plate ends. The application to the cylinder is preferably effected with the use of a doubled-sided adhesive film. The seam is closed by bringing the printing cylinder into contact with a rotating calender roll and joining the cut edges to one another by melting. For heating, DE-A 29 11 908 proposes either heating the calender roll from the inside or heating the photosensitive resin film by means of an IR lamp from the outside. Regarding the temperature, the publication states that the photosensitive material should soften but preferably should not flow.

The commonly assigned, as yet unpublished DE 103 18 042.7 application discloses a process for the production of cylindrical flexographic printing elements wherein a photopolymerizable layer is applied to a sleeve and the seam is joined by means of a calender roll while heating. For this purpose, the total calender roll is preferably heated from the inside. The heating may be supplemented by an IR lamp. The edges to be joined are cut as required by means of miter cuts.

In all documents cited, the photopolymerizable layer is heated in its entirety. As a result of this, however, the sleeve or the printing cylinder, too, and hence also the double-sided adhesive tape which is used for adhesive bonding of the photopolymerizable layer heats up with increasing calendering time. However, the adhesive force of the adhesive tapes decreases with increasing temperature so that the photopolymerizable layer is fixed on the sleeve only with a relatively small force and may slip. This results in a less smooth surface, so that the surface once again has to be refinished. Furthermore, a layer may also undergo plastic deformation in an undesired manner in the case of an excessively high temperature.

In addition to the problem of a high-quality seam closure and the obtaining of a layer thickness which is as constant as possible, preexposure from the back prevents a further problem of sleeve technology. Flexographic printing elements are usually preexposed before the actual main exposure from the back through the substrate film for a short time span. As a result of this, the relief background is prepolymerized and better anchoring, in particular of fine relief elements, in the relief background is achieved.

In the case of sleeves, preexposure from the back is as a rule not possible since the conventional sleeve materials, such as, for example, glass fiber-reinforced plastic or metal, are not transparent to UV radiation. EP-A 766 142 has proposed the use of transparent sleeves, in particular sleeves of polyesters, such as PET or PEN, in a thickness of from 0.25 mm to 5 cm. However, these are expensive. Furthermore, special exposure units for uniform exposure of the sleeve from the inside are required. Moreover, the person skilled in the art is faced with a typical dilemma in the case of transparent sleeves. The mechanical stability of the sleeve increases with increasing thickness of the sleeve whereas the transparency of the sleeve to actinic light decreases with increasing thickness of the sleeve. The problem of efficient exposure of sleeves from the back without reducing the stability of the sleeve is still unsolved.

It is possible in principle to preexpose a solid photopolymerizable layer from the back even before application of the sleeve. However, layers preexposed in this manner could not to date be welded as satisfactorily as would be expedient and necessary for the production of high-quality continuous seamless printing plates, because, as is known, only the uncrosslinked polymer layer, but not the exposed, crosslinked polymer layer, can be satisfactorily welded. Furthermore, the effect of the preexposure is frequently lost again as a result of the welding of the layer ends at elevated temperatures. Consequently, in particular fine relief dots are poorly anchored.

For solving this problem, DE-A 37 04 694 has therefore proposed firstly applying a first layer of photopolymer material to a sleeve, welding the seam and then polymerizing the photopolymeric layer from the front by exposure to light. In a second process step, a photopolymeric layer is applied to the first, already crosslinked layer and the seam thereof is also welded. This two-stage process is, however, inconvenient and expensive.

BRIEF SUMMARY OF THE INVENTION

It was an object of the invention to provide an improved process for the production of cylindrical, continuous seamless, photopolymerizable flexographic printing elements which ensures better closure of the seam than in the known technologies and very good true running. Preexposure from the back should be possible in a simple manner without impairing a satisfactory closure of the seam. Furthermore, refinishing of the flexographic printing element by grinding and calendering should be avoided, and the process should be capable of being carried out as rapidly as possible.

Accordingly, a process for the production of photopolymerizable cylindrical, continuous seamless flexographic printing elements was found, in which a layer composite comprising at least
  a layer of photopolymerizable material at least comprising
    an elastomeric binder, ethylenically unsaturated monomers and a photoinitiator, and
  a substrate film which can be peeled off from the layer,
is used as starting material, the process comprising the following steps:
  (a) cutting as required the edges of the layer composite to be joined, by means of miter cuts,
  (b) pushing on and locking a hollow cylinder on a rotatably mounted support cylinder,
  (c) applying an adhesion-promoting layer to the outer surface of the hollow cylinder,
  (d) applying that side of the layer composite cut as required which faces away from the peelable substrate film to the hollow cylinder provided with the adhesion-promoting layer, the ends provided with the miter cut lying substantially one on top of the other but not overlapping,
  (e) peeling off the substrate film from the layer of photopolymerizable material,
  (f) joining the cut edges by bringing the surface of the photopolymerizable layer on the hollow cylinder into contact with a rotating calender roll while heating, until the cut edges have been joined to one another,
  (g) peeling off the processed hollow cylinder from the support cylinder,
    a locally acting heat source which heats the photopolymerizable layer from the top being used for the heating in step (f), and the heat source being displaced axially relative to the hollow cylinder over the total width of the photopolymerizable layer.

In a preferred embodiment of the invention, the adhesion-promoting layer is a double-sided adhesive tape.

Furthermore, apparatus particularly suitable for carrying out the process was found. By means of the process according to the invention, it was possible, in a surprisingly simple manner, to obtain cylindrical, continuous seamless photopolymerizable flexographic printing elements of high quality. The apparatus used according to the invention for the production of the sleeves leads to only small thermal load on the photopolymerizable layer and accordingly to high precision of the layer. Refinishing of the flexographic printing element obtained by complicated grinding and calendering processes is superfluous. Nevertheless, a very good seam closure is achieved, as could be shown by measurements of the tensile stress. Preexposure of the flexographic printing element from the back is possible even without the need to use a transparent sleeve.

BRIEF DESCRIPTION OF THE SEVERAL VIEWS OF THE DRAWINGS

FIG. 2: Plan view of an apparatus according to the invention (schematic).

DETAILED DESCRIPTION OF THE INVENTION

Figure 1:
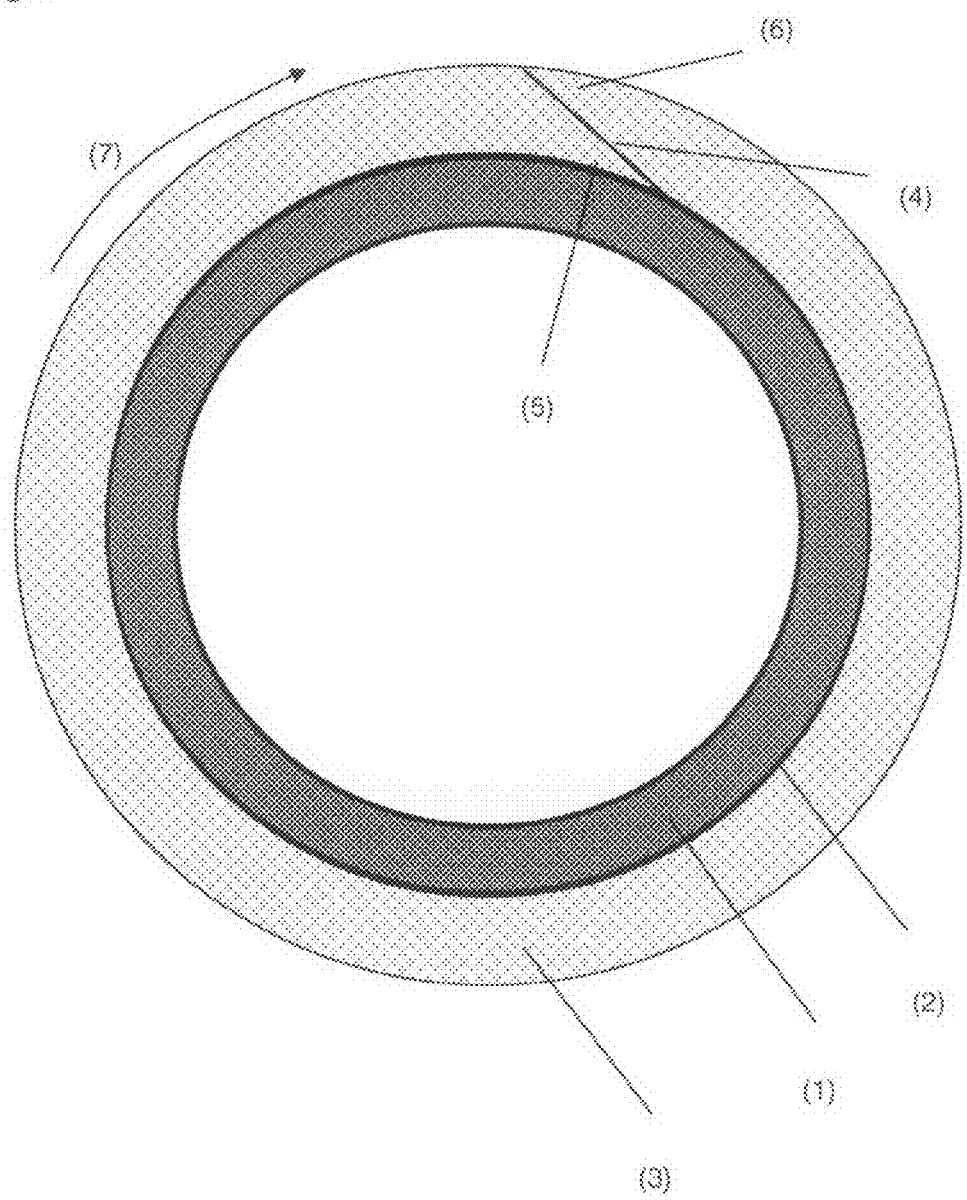
FIG. 1: Cross section through a flexographic printing element which has been prepared for calendering and in which the edges to be joined have been cut as required by means of a miter cut and placed one on top of the other (schematic).

Regarding the invention, the following can be stated specifically:

A layer composite which comprises at least one elastomeric layer of a photopolymerizable material and a substrate film which can be peeled off from the layer is used as starting material for the process. The layer composite can optionally also comprise a further peelable film on that side of the layer which faces away from the substrate film. Both the substrate film and the second film may have been treated in a suitable manner for better peelability, for example by siliconization or by coating with a suitable nontacky release layer. Such nontacky release layers are known in the area of flexographic printing plate technology and may consist, for example, of polyamides or polyvinyl alcohols.

The photopolymerizable material comprises conventional photopolymerizable materials which are typical for use in flexographic printing, elements and comprise at least one elastomeric binder, ethylenically unsaturated monomers and a photoinitiator or a photoinitiator system. Suitable mixtures are disclosed, for example, in EP-A 084 851.

The elastomeric binder may be a single binder or a mixture of different binders. Examples of suitable binders are the known vinylaromatic/diene copolymers or block copolymers, such as, for example, conventional block copolymers of the styrene/butadiene or styrene/isoprene type, and furthermore diene/acrylonitrile copolymers, ethylene/propylene/diene copolymers or ethylene/acrylate/acrylic acid copolymers. Mixtures of different binders can of course also be used.

Binders or binder mixtures which have as little tack as possible are preferably used for the process according to the invention. Thermoplastic elastomeric binders of the styrene/butadiene type have proven particularly useful for the process according to the invention. These may be two-block copolymers, three-block copolymers or multiblock copolymers in which in each case a plurality of styrene and butadiene blocks follow one another alternately. They may be linear, branched or star-like block copolymers. Block copolymers used according to the invention are preferably styrene/butadiene/styrene three-block copolymers, it being necessary to take into account the fact that commercially available three-block copolymers usually have a certain proportion of two-block copolymers. Such block copolymers are commercially available, for example under the name Kraton®. Of course, mixtures of different SBS block copolymers may also be used. From the various types, the person skilled in the art makes a suitable choice according to the desired properties of the layer.

Styrene/butadiene block copolymers which have an average molecular weight $M_w$ (weight average) of from 100 000 to 250 000 g/mol are preferably used. The preferred styrene content of such styrene/butadiene block copolymers is from 20 to 40% by weight, based on the binder.

The ethylenically unsaturated monomers are in particular acrylates or methacrylates of mono- or polyfunctional alcohols, acrylamides or methacrylamides, vinyl ethers or vinyl esters. Examples comprise butyl (meth)acrylate, 2-ethylhexyl (meth)acrylate, butanediol di(meth)acrylate or hexanediol di(meth)acrylate.

Mixtures of different monomers can of course also be used. Aromatic compounds, for example keto compounds, such as benzoin or benzoin derivatives, are suitable as initiators for the photopolymerization.

The photopolymerizable mixtures may furthermore comprise conventional assistants, such as, for example, thermal polymerization inhibitors, plasticizers, dyes, pigments, photochromic additives, antioxidants, antiozonants or extrusion assistants.

The type and amount of the components of the photopolymerizable layer are determined by the person skilled in the art according to the desired properties and the desired use of the flexographic printing element.

If the flexographic printing element is to be processed by means of direct laser engraving to give a flexographic printing plate, the person skilled in the art can advantageously choose particularly adapted formulations for the layer for the direct laser engraving. Such formulations are disclosed, for example, in WO 02/76739, WO 02/83418 or the still unpublished documents having the Application numbers DE 101 57 769.9, DE 102 27 188.7 and DE 102 27 189.5 to which reference is expressly made at this point.

The layer composite can be produced in a manner known in principle by dissolving all components of the photopolymerizable layer in a suitable solvent, pouring the solution onto the peelable substrate film and allowing the solvent to evaporate. The layer composite is preferably produced in a manner known in principle by melt extrusion and calendering between the peelable substrate film and a further peelable film. Such photopolymerizable layer composites are also commercially available, for example as Nyloflex® SL (BASF Drucksysteme GmbH). It is also possible to use layer composites which have two or more photopolymerizable layers. The thickness of the layer composite is as a rule from 0.4 to 7 mm, preferably from 0.5 to 4 mm and particularly preferably from 0.7 to 2.5 mm.

The photopolymerizable layer can optionally be preexposed to actinic light from the back before application to the hollow cylinder in process step (d). The preexposure is carried out on that side of the photopolymerizable layer which faces away from the substrate film, i.e. the subsequent bottom of the layer. During the preexposure, the surface of the photopolymerizable layer can be directly irradiated. If a second peelable film is present, this second film can either be peeled off, or exposure is preferably effected through the film, provided that the film is sufficiently transparent.

The preexposure procedure is carried out analogously to the conventional exposure of flexographic printing plates from the back. The preexposure time is as a rule only a few seconds to about one minute and is determined by the person skilled in the art according to the desired properties of the layer. Of course, the preexposure time also depends on the intensity of the actinic light. Only the layer background is partly polymerized, but on no account is the total layer completely polymerized.

The person skilled in the art determines whether a preexposure step is carried out or not, depending on the desired use of the flexographic printing element. If the further processing of the flexographic printing element to give flexographic printing plates in a conventional manner by imagewise exposure and development by means of a solvent is intended, preexposure is as a rule advisable, even if not always absolutely essential. If further processing by means of direct laser engraving is intended, a preexposure step is as a rule superfluous.

The preexposure should as a rule be effected before the layer composite is cut as required in step (a), in order to ensure problem-free joining of the cut edges. If a transparent sleeve is used, the preexposure can of course also be effected from the inside of the sleeve once the layer has been applied to the sleeve.

In process step (a), the edges of the provided layer composite which are to be joined are cut as required. According to the invention, the cutting as required is carried out by means of miter cuts, i.e. by means of cuts which are made not perpendicularly through the layer composite but obliquely. The length of the layer composite is dimensioned by the cuts so that the circumference of the sleeve can be completely surrounded and the ends provided with the miter cuts lie substantially one on top of the other but do not overlap.

As a rule, the miter angle is from 10° to 80°, preferably from 20° to 70°, particularly preferably from 30° to 60° and, for example, 50°. Said angles relate in each case to the perpendicular through the cut. Both cut edges can be cut with the same miter angle. Relatively small deviations of the miter angle of both cut edges from one another are, however, also possible without the proper joining of the cut edges being adversely affected. Rather, slightly different miter angles make it possible to take into account in a particularly elegant manner the fact that the internal diameter of the photopolymerizable layer is slightly smaller than the external diameter. The miter angles are calculated so that, after cutting, the subsequent inside of the photopolymerizable layer is shorter than the subsequent outside by exactly the correct amount. However, the angles should as a rule deviate by not more than about 20°, preferably not more than 10°, from one another.

Of course, the lateral edges can also be cut as required if the width of the raw material does not already fit. The lateral edges are preferably cut straight. Of course, the width of the layer composite cannot exceed the maximum sleeve length. As a rule, instead of covering the total length of the sleeve with the photopolymeric material, a narrow strip is left uncovered at each of the ends. This is determined by the person skilled in the art according to the desired properties of the flexographic printing element.

The hollow cylinders used as substrate are conventional hollow cylinders for flexographic printing, preferably those which are suitable for mounting on air cylinders, i.e. those which can expand slightly under the influence of compressed air. Such hollow cylinders are also referred to as sleeves, base sleeves or the like. For the purposes of this invention, the hollow cylinders used as substrates are to be referred to as such as hollow cylinders while the term "sleeve" is to be reserved for the flexographic printing element as a whole, i.e. including the photopolymerizable layer, adhesive layer and possible further layers.

Hollow cylinders of polymeric materials, such as, for example, polyurethanes, polyesters or polyamides, are particularly suitable for carrying out the process according to the invention. The polymeric materials may also be reinforced, for example with glass fabrics. They may also be multilayer materials. Furthermore, hollow cylinders of metals, for example those of nickel, can of course be used.

The thickness, diameter and length of the hollow cylinder are determined by the person skilled in the art according to the desired properties and the desired use. By varying the wall thickness with constant internal diameter (necessary for mounting on certain printing cylinders), the outer circumference of the hollow cylinder and hence the printing length can be determined. "Printing length" is understood by the person skilled in the art as meaning the length of the printed motif during one revolution of the printing cylinder. Suitable hollow cylinders having wall thicknesses of from 1 to 100 mm are commercially available, for example as Blue Light from Rotec or from Polywest or Rossini. They may be both compressible hollow cylinders and hard-coated hollow cylinders.

For carrying out the process according to the invention, the hollow cylinders used are pushed onto a rotatably mounted support cylinder in process step (b) and locked so that the hollow cylinder is firmly connected to the support cylinder and no movement relative to one another is possible. The support cylinder provides firm retention for the subsequent calendering process. The locking can be effected, for example, by clamping or screwing. However, the support cylinder is preferably an air cylinder whose mode of operation corresponds to the air cylinders used in printing presses. The hollow cylinder is then mounted very elegantly by connecting the air cylinder to compressed air for the pushing on operation, and pushing on of the hollow cylinder is thus permitted. After the compressed air has been switched off, the hollow cylinder is firmly locked on the air cylinder. The circumference of the air cylinder can also be increased in a manner known in principle by using so-called adapter or bridge sleeves. Hollow cylinders having a relatively large internal diameter can thus be used, relatively large printing lengths are therefore also achievable with the same air cylinder. Adapter sleeves are also commercially available (for example from Rotec).

In process step (c), an adhesion-promoting layer is applied to the outer surface of the hollow cylinder. The adhesion-promoting layer should also impart good adhesion at elevated temperatures such as those which prevail during the calendering process. It should in particular impart very good shear strength so that the photopolymerizable layer does not slip on the surface of the hollow cylinder during the calendering process. The adhesion-promoting layer may be a suitable mixture of adhesive-forming components which is applied to the surface of the hollow cylinder.

Preferably, however, the adhesion-promoting layer is a double-sided adhesive film. Double-sided adhesive films for mounting printing plates are known and are available in various embodiments. In particular, the adhesive film may be adhesive foam films which additionally have a damping foam layer.

Adhesive foam tapes may be, for example, an adhesive tape based on open-cell or closed-cell PU foam. However, they may also comprise other materials. Owing to the low thermal load in the process according to the invention, PE foams can also particularly advantageously be used.

The adhesive film should have a static shear strength which is as high as possible. The static shear strength is determined on the basis of DIN EN 1943. In this test, a piece of the adhesive film having exactly defined dimensions is adhesively bonded to a polished metal plate and pulled thereon horizontally with an exactly defined force. The time taken for the tape to move 2.5 mm on the substrate is measured. The test can be carried out at elevated temperatures. The details for the test are summarized in the example section.

For carrying out the present invention, an adhesive film which has a static shear strength of at least 3 h, preferably at least 10 h and particularly preferably at least 20 h at 70° C. is preferably used.

The double-sided adhesive tape should be adhesively bonded to the surface of the hollow cylinder so that the cut edges exactly abut one another and substantially neither is there a remaining space between the ends nor do the ends overlap. It is very particularly advantageous also to cut the adhesive tape as required by means of a miter cut. Angles of from 5 to 20°, preferably from 5 to 10°, have proven useful. Ends which lie very well one on top of the other are obtained thereby. In order to ensure that the cut edges lie one on top of the other well, the adhesive bonding of the adhesive film is expediently begun with the cut edge whose bottom is longer than the top. After complete winding, the second cut edge, for which the top is longer than the bottom, finally lies precisely on the first cut edge.

In process step (d), the photopolymerizable layer is applied to the hollow cylinder provided with the adhesion-promoting layer. For this purpose, the layer composite cut as required is applied, with the side facing away from the temporary substrate film, to the hollow cylinder provided with the adhesion-promoting layer. If a second peelable film is present, this—including any nontacky release layer present—will of course be removed before the application. The application should be effected in a bubble-free manner and is carried out so that the ends provided with the miter cut lie substantially one on top of the other but do not overlap.

FIG. 1 schematically shows a cross section through a flexographic printing element which has been prepared for calendering and in which the edges to be joined have each been cut as required by means of a miter cut and placed one on top of the other: the adhesive tape (2) and the photopolymerizable layer (3) are mounted on the hollow cylinder (1). The edges to be joined are cut as required by means of miter cuts (4) and placed one on top of the other. The arrow (7) indicates the preferred direction of rotation of the flexographic printing element during calendering. The air cylinder has been omitted in FIG. 1 for the sake of clarity.

In order to ensure that the cut edges lie properly one on top of the other, the mounting of the layer element is therefore expediently begun with the cut edge whose bottom is longer than the top (FIG. 1, (5)). After complete winding, the second cut edge (6), for which the top is longer than the bottom, finally lies on the first cut edge.

After the layer element has been mounted, the substrate film, including any nontacky release layer present, is peeled off from the layer of photopolymeric material (process step (e)).

In process step (f), the cut edges are joined. For joining the cut edges, the surface of the photopolymerizable layer is brought into contact on the hollow cylinder with a rotating calender roll until the cut edges have been joined to one another. The support cylinder and the calender roll rotate in opposite directions. The necessary calender pressure is determined by the person skilled in the art according to the type of photopolymerizable layer, by adjusting the distance between the support cylinder and the calender roll.

The photopolymerizable layer is heated from the surface for the joining. According to the invention, a heat source which acts only locally is used for this purpose. In the context of this invention, the term "locally" means that the heat source must not act on the entire width of the photopolymerizable layer all at once but that the heat source can act only on a limited section of the photopolymerizable layer.

The size of the heatable section depends on the specific circumstances, such as, for example, the type of heat source and the diameter and the width of the hollow cylinder. Based on the width of the hollow cylinder, a section of not more than 20% thereof is as a rule simultaneously heatable, preferably not more than 10%.

The heat source heats the photopolymerizable layer locally from the surface. Under the influence of the heat source used according to the invention, the photopolymerizable layer is not heated uniformly in the total volume, but the heat source heats substantially only the uppermost section of the photopolymerizable layer. In other words, the photopolymerizable layer has a temperature gradient. The temperature of the layer is highest at or close to the surface and then decreases with increasing distance from the surface. This does not mean that the layer must be at room temperature at the bottom, but the temperature is lower than at the surface.

Particularly suitable for carrying out the invention are warm gas streams which can be produced, for example, by hot air blowers. In particular, the surface of the photopolymerizable layer is heated thereby. From there the heat can spread only by dissipation.

However, other heat sources are of course also possible, provided that the surface can be heated thereby only in a defined manner. For example, IR lamps would be conceivable, provided that they focus exclusively on the layer surface.

According to the invention, the heat source for the joining is displaced axially relative to the hollow cylinder covered with the photopolymerizable layer, over the total width of the layer. The combination of the axial movement of the heat source with the rotational movement of the hollow cylinder results in the focus of the heat source executing a helical movement over the surface of the hollow cylinder. In this manner, the total surface of the photopolymerizable layer is gradually heated once by the heat source.

The temperature required for joining the seam depends on the type of photopolymerizable layer and the desired properties. However, it is essential to avoid melting. According to the invention, the temperature of the surface is therefore adjusted so that the temperature of the photopolymerizable layer is in any case below the melting point thereof. The temperature at the surface is as a rule from 70 to 120° C., preferably from 80 to 110° C. and particularly preferably from 90 to 100° C. The surface temperature can be measured, for example, using a commercially available noncontact thermometer.

The calender roll may be unheated. However, it may also be advantageous to heat the calender roll—for example by means of internal heating—to a temperature greater than room temperature but to less than that surface temperature of the photopolymerizable layer which has been chosen for the joining. Consequently, unnecessary heat losses are avoided, for example in the case of particularly large hollow cylinders. As a rule, the temperature of the calender roll is at least 10° C. lower than the temperature of the surface. Temperatures of from 25 to 85° C., preferably from 30 to 75° C. and particularly preferably from 35 to 65° C. have proven useful.

Regarding the speed at which the heat source is moved axially, from 0.5 to 10 cm/min, preferably from 1 to 6 cm/min and particularly preferably from 2 to 4 cm/min have proven useful, without there being any intention to restrict the invention thereto.

The calendering is particularly preferably effected so that the coated hollow cylinder rotates in the direction (7) during calendering. The preferred direction of rotation is indicated in FIG. 1 by the arrow (7) and can be achieved by corresponding adjustment of the direction of rotation of the rolls. Since the calender roll and the coated hollow cylinder rotate in opposite directions during calendering, the upper cut edge (6) is calendered in the direction of the decreasing layer thickness in the case of this direction of rotation. Opening of the gap is thus advantageously avoided, although it is also possible in special cases to calender in the opposite direction.

By means of the process according to the invention, the layer is heated to a sufficient extent to achieve very strong joining of the cut edges. Joining is effected mainly in the upper region of the photopolymeric layer. By measurements of the tensile stress, it is possible to show that the strength of the layer in the region of the seam is just as good as in regions outside the seam.

At the same time, the thermal load of the total sleeve is kept low. In particular, the adhesive tape is subjected to a much lower thermal load than in the heating of the total layer. The layer is always subjected to a thermal load only in one area but not over the total length and thus substantially retains its resilience. Plastic deformation of the layer is substantially avoided. The process therefore advantageously leads to sleeves having particularly high dimensional stability.

In the process according to the invention, monomers evaporate only to an insignificant extent, if at all, owing to the comparatively low thermal load during calendering. Furthermore, the effect of preexposure from the back is also retained. Both contribute to the constant high layer quality, a precondition for high-quality printing plates.

After the seam has been closed, the processed hollow cylinder/final sleeve is removed again from the support cylinder (process step (g)).

The apparatus according to the invention for carrying out the process is shown in FIG. 2.

The apparatus has a support cylinder (8) and a calender roll (9). Both cylinders are rotatably mounted. For the sake of clarity, the suspensions in the cylinders are not shown. At least one of the two rolls is moreover displaceably mounted so that the rolls can be moved toward one another and apart. This is shown schematically by the double-headed arrow (10). The calender roll may be heatable. It should have as little adhesion as possible to the photopolymerizable layer. It can, for example, be polished or have a coating for imparting non-tacky properties, for example a Teflon coating. The support cylinder (8) is preferably an air cylinder.

According to the invention, the apparatus furthermore comprises a heat source (11) directed toward the surface of the apparatus. This may be, for example, a hot air blower. The heat source is mounted on a suitable apparatus (12) so as to be displaceable axially relative to the support cylinder (8). The axial movement is generated by a suitable drive unit (not shown).

The apparatus can of course also comprise further assemblies. For example, an auxiliary roll whose distance from the air cylinder can be adjusted may be provided as an aid for mounting. An auxiliary roll is preferably arranged below the air cylinder. The auxiliary roll is preferably a rubber roll. The apparatus may furthermore have a delivery apparatus for the photopolymerizable layer and/or the adhesive film. The delivery apparatus may be, for example, simply a mounting table on which the photopolymerizable layer and/or the adhesive film can be placed and can be pushed from there steadily into the gap between hollow cylinder and auxiliary roll. This can be performed manually, preferably by means of a suitable pushing apparatus. Further details of such additional apparatuses are disclosed, for example, in DE 103 18 042.7.

The operation of the apparatus is explained by way of example below without there being any intention thereby to limit the invention to this mode of operation.

For carrying out the process, a hollow cylinder (1) is first pushed onto the support cylinder (8). The hollow cylinder may already have been provided with an adhesive layer (2) and a photopolymerizable layer (3) prior to application. However, it can also be provided with the adhesive layer and the photopolymerizable layer only after application to the support cylinder. This can be effected, for example, by cutting adhesive film to size on a mounting table, causing the support cylinder to rotate and slowly pushing the film into the gap between an auxiliary roll and the support cylinder (8) provided with the hollow cylinder. As a result of the rotation, the adhesive film is carried along, the auxiliary roll pressing the film onto the hollow cylinder so that the adhesive film adhesively bonds to the hollow cylinder without bubbles. The protective film is then peeled off from the adhesive film. The hollow cylinder, then, has been provided with an adhesion-promoting layer. In the next step, the photopolymerizable layer composite which has been cut to size is pushed into the gap, carried along and pressed firmly by the auxiliary roll. The optionally preexposed bottom of the layer faces the hollow cylinder. If the photopolymerizable layer has a second, peelable film, this is peeled off beforehand.

After the substrate film of the layer composite has been peeled off, the calender roll and the air cylinder provided with hollow cylinder, adhesion-promoting layer and photopolymerizable layer are brought into contact with one another and caused to rotate. The preferred direction of rotation during calendering is (7). Heating of the photopolymerizable layer superficially, for example by means of a hot gas stream (14), is then begun by means of the heat source (11). The heat source (11) moves axially relative to the support cylinder. This is indicated in FIG. 2 by means of the arrow (13). The combination of the axial movement of the heat source (11) with the rotational movement of the hollow cylinder results in the focus of the heat source executing a helical movement over the surface of the hollow cylinder.

The process steps (a) to (g) can be carried out in this sequence. However, variations are also possible. It is therefore entirely possible first to apply the adhesion-promoting layer (step (b)) and the photopolymerizable layer (step (d)) to the hollow cylinder and only thereafter to push the coated hollow cylinder onto the support cylinder.

The cylindrical, continuous seamless flexographic printing elements obtainable by the process according to the invention are easily distinguishable from other sleeves. Traces of the miter cut are still detectable as a discontinuity in the region of the closed seam by means of suitable methods of analysis (for example examination under a microscope, if appropriate by means of polarized light). If preexposure was effected, the seam is clearly detectable in the lower region of the layer. Nevertheless, a printing layer which is completely uniform with respect to the printing properties is obtained, so that no visible seam is present in the printed image. Measurements of the tensile stress using layer samples from the region of the closed seam and those without a seam have comparable values.

The flexographic printing elements according to the invention are outstandingly suitable as starting material for the production of cylindrical, continuous seamless flexographic printing plates.

The further processing to give flexographic printing plates can be effected by various techniques. The flexographic printing elements can, for example, be exposed imagewise in a known manner, and the unexposed regions of the relief-forming layer can then be removed by means of a suitable development process. The imagewise exposure can in principle be effected by winding a photographic mask around the sleeve and carrying out exposure through the mask.

However, the imaging is preferably carried out by means of digital masks. Such masks are also known as in situ masks. For this purpose, a digitally imageable layer is first applied to the photopolymerizable layer of the sleeve.

The digitally imageable layer is preferably a layer selected from the group consisting of IR-ablative layers, inkjet layers and thermographically inscribable layers.

IR-ablative layers or masks are opaque to the wavelength of actinic light and usually comprise a binder and at least one IR absorber, such as, for example, carbon black. Carbon black also ensures that the layer is opaque. A mask can be inscribed into the IR-ablative layer by means of an IR laser, i.e. the layer is decomposed and removed at the points where it is struck by the laser beam. Examples of the imaging of flexographic printing elements using IR-ablative masks are disclosed, for example, in EP-A 654 150 or EP-A 1 069 475.

In the case of inkjet layers, a layer which is inscribable using inkjet inks and is transparent to actinic light, for example a gelatin layer, is applied. A mask is applied by means of inkjet printers using opaque ink into said layer. Examples are disclosed in EP-A 1 072 953.

Thermographic layers are layers which comprise substances which become black under the influence of heat. Such layers comprise, for example, a binder and an organic silver salt and can be imaged by means of a printer using a thermal printing head. Examples are disclosed in EP-A 1 070 989.

The digitally imageable layers can be produced by dissolving or dispersing all components of the respective layer in a suitable solvent and applying the solution to a photopolymerizable layer of the cylindrical flexographic printing element, followed by evaporation of the solvent. The application of the digitally imageable layer can be effected, for example, by spraying on or by means of the technique described in EP-A 1 158 365. Components soluble in water or predominantly aqueous solvent mixtures are preferably used for producing the digitally imageable layer.

After the application of the digitally imageable layer, this is imaged by means of the respective suitable technique, and the sleeve is then irradiated through the resulting mask in a manner known in principle by means of actinic light. Suitable actinic light, i.e. chemically "active" light, is known to be, in particular UVA or UV/VIS radiation. Rotary, cylindrical exposure units for uniform exposure of sleeves are commercially available.

The development of the imagewise exposed layer can be effected in a conventional manner by means of a solvent or of a solvent mixture. The unexposed regions of the relief layer, i.e. those covered by the mask, are removed by dissolution in the developer, while the exposed, i.e. the crosslinked regions are retained. The mask or the residues of the mask are likewise removed by the developer if the components are soluble therein. If the mask is not soluble in the developer, it is, if appropriate, removed prior to development with the aid of a second solvent.

The development can also be effected thermally. In the case of the thermal development, no solvent is used. Instead, the relief-forming layer is brought into contact with an absorbent material after the imagewise exposure and is heated. The absorbent material is, for example, a porous nonwoven, for example comprising nylon, polyester, cellulose or inorganic materials. It is heated to a temperature such that the unpolymerized parts of the relief-forming layer liquefy and can be absorbed by the nonwoven. The saturated nonwoven is then removed. Details of the thermal development are disclosed, for example, in U.S. Pat. No. 3,264,103, U.S. Pat. No. 5,175, 072, WO 96/14603 or WO 01/88615. The mask can, if appropriate, be removed beforehand by means of a suitable solvent or likewise thermally.

The production of cylindrical flexographic printing plates from the photopolymerizable, continuous seamless flexographic printing elements can be carried out by means of direct laser engraving.

In this process, the photopolymerizable layer is first crosslinked completely in the total volume by means of actinic light without application of a mask. A print relief is then engraved into the crosslinked layer by means of one or more lasers.

The full-surface crosslinking can be effected using conventional rotary, cylindrical exposure units for sleeves as described above. Particularly advantageously, however, it can also be effected on the basis of the process described in WO 01/39897. Here, the procedure is effected in the presence of an inert gas which is heavier than air, for example $CO_2$ or Ar. For this purpose, the photopolymerizable, cylindrical flexographic printing element is lowered into an immersion tank which is filled with inert gas and whose walls are preferably lined with a reflective material, for example aluminum foil. The lowering is preferably effected so that the axis of rotation of the cylindrical flexographic printing element is vertical. The filling of the immersion tank with inert gas can be effected, for example, by introducing dry ice, which displaces the atmospheric oxygen on evaporation, into the immersion tank. However, the filling can also be effected by slowly filling the tank with the inert gas by means of nozzles installed at or in the vicinity of the bottom of the tank. It is not necessary thereby to displace the oxygen completely. As a rule, a reduction of the oxygen concentration to less than 5% by volume of $O_2$, preferably less than 3% by volume and particularly preferably less than 1% by volume is sufficient.

Exposure is then effected from above by means of actinic light. For this purpose, it is possible in principle to use the conventional UV or UV/VIS sources of actinic light. Radiation sources which emit substantially visible light and no UV light or only small fractions of UV light are preferably used. Light sources which emit light having a wavelength of more than 300 nm are preferred. For example, conventional halogen lamps may be used. The process has the advantage that the ozone pollution usual in the case of short-wave UV lamps is virtually completely absent, safety measures against strong UV radiation are as a rule unnecessary and no complicated apparatuses are required. Thus, this process step can be carried out particularly economically.

In the case of direct laser engraving, the relief layer absorbs laser radiation to such an extent that it is removed or at least detached in those parts which are exposed to a laser beam of sufficient intensity. The layer is preferably vaporized or thermally or oxidatively decomposed before melting, so that its decomposition products are removed from the layer in the form of hot gases, vapors, fumes or small particles.

Lasers which have a wavelength of from 9000 nm to 12 000 nm are particularly suitable for engraving the relief-forming layers used according to the invention. $CO_2$ lasers may be mentioned in particular by way of example here. The binders used in the relief-forming layer absorb the radiation of such lasers to a sufficient extent to permit engraving.

A laser system which has only a single laser beam can be used for the engraving. However, laser systems which have two or more laser beams are preferably used. Preferably, at least one of the beams is specially adapted for producing coarse structures and at least one of the beams is specially adapted for recording fine structures. With such systems, high-quality printing plates can be produced in a particularly elegant manner. For example, the beam for producing the fine structure may have a lower power than the beams for producing coarse structures. Multibeam laser systems particularly suitable for laser engraving and suitable engraving processes are known in principle and are disclosed, for example, in EP-A 1 262 315 and EP-A 1 262 316.

The depth of the elements to be engraved depends on the total thickness of the relief and on the type of elements to be engraved and is determined by the person skilled in the art according to the desired properties. The depth of the relief element to be engraved is at least 0.03 mm, preferably 0.05 mm, the minimum depth between the individual dots being meant here. Printing plates having relief depths which are too small are as a rule unsuitable for printing by means of the flexographic printing technique because the negative elements fill with printing ink. Individual negative dots should usually have greater depths; for those of 0.2 mm diameter, a depth of at least 0.07 to 0.08 mm is usually advisable. In the case of areas which have been removed by engraving, a depth of more than 0.15 mm, preferably more than 0.4 mm, is advisable. The latter is of course possible only in the case of a correspondingly thick relief.

The cylindrical flexographic printing plate obtained can advantageously be cleaned after the laser engraving in a further process step. In some cases, this can be effected by simply blowing off with compressed air or brushing off.

However, it is preferable to use a liquid cleaning agent for the subsequent cleaning, in order also to be able to remove polymer fragments completely.

For example, aqueous cleaning agents substantially comprise water and optionally small amounts of alcohols and which may comprise assistants, such as, for example, surfactants, emulsifiers, dispersants or bases, for supporting the cleaning process are suitable. Water-in-oil emulsions, as disclosed in EP-A 463 016, are also suitable.

The cylindrical printing plates obtained by means of digital imaging or by means of direct laser engraving are outstandingly suitable for the printing of continuous patterns. They may also have any desired printing regions in the region of the seam without the seam also being visible in the printed image. If adhesive tape was used as the adhesion-promoting layer, the printing layer can be very easily removed again from the hollow cylinder and this can be used again. Hollow cylinders of different types can be used here, for example compressible hollow cylinders or hard-coated hollow cylinders.

The examples which follow are intended to explain the invention in more detail:

Methods of Measurement:

Determination of the static shear strength of the adhesive film on the basis of DIN EN 1943 *"Adhesive tapes—Measurement of the shear resistance under static load"* (January 2003 edition).

Testing was effected according to method A described. A steel plate specified in DIN EN 1943 was used for the test. The steel plate was clamped perpendicularly in a holding apparatus. A sample strip of the adhesive film having a width of 25 mm was adhesively bonded thereon so that the contact area of the steel plate was exactly 25 mm×25 mm and a part of the adhesive tape hung perpendicularly below the steel plate. A test mass of 1 kg was suspended from the freely hanging end of the adhesive tape. The test was carried out at 70° C. The time taken for the adhesive tape to slip 2.5 mm downward on the steel plate was determined.

Provision of the Layer Composite:
Layer Element 1:

The following starting materials were used for the photopolymerizable, elastomeric layer:

| Component | Amount |
|---|---|
| SBS block copolymer ($M_w$ 125 000 g/mol, styrene content 30% by weight (Kraton D 1102) | 55% |
| Polybutadiene oil plasticizers | 32% |
| Hexanediol diacrylate monomer | 10% |
| Photoinitiator | 2% |
| Additives (heat stabilizer, dye) | 1% |
| Total | 100% |

The layer element used as a starting material for the process according to the invention was produced in a manner known in principle from the components by melt extrusion and calendering between two peelable PET films coated with a non-tacky release layer (substrate film and second film). The photopolymerizable layer had a thickness of 1.14 mm.

Layer Element 2:

A layer element was produced in the same manner as for layer element 1, except that the following starting materials were used for the photopolymerizable layer.

| Component | Amount |
|---|---|
| SBS block copolymer ($M_w$ 125 000 g/mol, styrene content 30% by weight, extended by about 33% of oil (Kraton D 4150) | 58% |
| Secondary binder SB two-block copolymer, $M_w$ 230 000 g/mol (Kraton DX 1000) | 10% |
| Polybutadiene oil plasticizer | 23% |
| Hexanediol diacrylate monomer | 7% |
| Photoinitiator | 1% |
| Additives (heat stabilizer, dyes) | 1% |
| Total | 100% |

Production of the Cylindrical, Continuous Seamless Flexographic Printing Elements:

Example 1

For carrying out the process, an apparatus of the type described above was used (FIG. 2). The calender roll was Teflon-coated. The apparatus additionally had a rubber-coated auxiliary roll mounted below the air cylinder on a simple mounting table. The apparatus had a hot air blower as a displaceable heat source.

A hollow cylinder (Blue Light, from Rotec, internal diameter 136.989 mm, external diameter 143.223 mm, length 65 cm) was pushed onto the air cylinder of the apparatus described above and was fixed. The hollow cylinder was then covered with a 500 µm thick compressible adhesive tape having a high shear strength (Rogers SA 2120, shear strength at 70° C.>100 h) without leaving a gap. The compressible layer of the adhesive tape consisted of an open-cell PU foam. The adhesive tape was cut to size by means of a miter cut (angle about 7°).

Layer element 1 was exposed to actinic light for 12 s from the back through one of the two PET films. Layer element 1 was then cut to size. The two abutting edges were cut as required with an angle of 50° and 55°, relative in each case to the perpendicular, in particular in such a way that the preexposed side of the layer was shorter than the side which had not been preexposed. The layer element was placed on the mounting table so that the preexposed side faced upward, and the film, including the nontacky release layer, was peeled off on the preexposed side.

The support cylinder with the hollow cylinder was caused to rotate, and the layer element, with the preexposed side facing upward, was slowly pushed completely into the gap between auxiliary roll and hollow cylinder and thus applied to the hollow cylinder provided with the adhesive film. After application of the layer, the second PET film, including the nontacky release layer, was peeled off.

The calender roll was caused to rotate (50 rpm) and was brought into contact with the photopolymerizable layer. The distance between the calender roll and the air cylinder was adjusted so that a "negative gap" of from 50 to 80 µm resulted (i.e. the calender roll was pressed from 50 to 80 µm into the elastomeric, photopolymerizable layer). The rotation was effected in direction (7). The temperature of the calender roll was 50° C.

The hot air blower was then switched on and the blower was moved at a speed of about 3 cm/min from one end of the hollow cylinder provided with the photopolymerizable layer to the other end (duration about 20 min). The power of the hot air blower was measured so that the surface temperature of the photopolymerizable layer, measured by means of a noncontact thermometer at the point just heated by the gas stream, was about 90 to 100° C. Thereafter, the rolls were moved apart again and the coated hollow cylinder was removed again from the air cylinder.

A cylindrical, photopolymerizable continuous seamless flexographic printing element was obtained. The surface of the printing element was completely flat in the region of the seam, and no traces of the seam at all were detectable. A cut in the region of the seam showed that the seam was not completely closed in the preexposed region of the layer but the closure in the upper region of the layer was so good that overall an extremely stable bond was obtained.

Example 2

The procedure was as in example 1, except that layer element 2 was used as starting material. The surface temperature of the flexographic printing element during calendering was 100° C.

A cylindrical, photopolymerizable continuous seamless flexographic printing element was obtained.

Example 3

The procedure was as in example 1, except that 5 hollow cylinders were processed directly in succession to give a continuous seamless flexographic printing element. The temperature of the support roll remained unchanged.

Comparative Example 1

The procedure was as in example 1, except that the hot air blower was not used. Instead, the calender roll was heated to about 130° C. and the elastomeric layer was calendered for about 15 min. The surface temperature of the photopolymerizable layer was about 90 to 100° C. over the total length.

Comparative Example 2

The procedure was as in comparative example 1, except that 5 hollow cylinders were processed directly in succession to give a continuous seamless flexographic printing element. The temperature of the support roll (not heated per se) increased from experiment to experiment. The last flexographic printing element of the experimental series had waves in the surface. It was further processed and tested as described below.

Further Processing to Give Flexographic Printing Plates

Example 3

An IR-ablative digitally imageable layer comprising carbon black and a binder was applied in a manner known in principle by means of a ring coater as described in DE 299 02 160 to the cylindrical, photopolymerizable flexographic printing elements according to experiment 1.

The resulting photosensitive flexographic printing element having an IR-ablative layer was then inscribed imagewise with a continuous pattern by means of an Nd/YAG laser. The pattern was chosen so that printing regions, too, were provided in the region of the seam.

The imaged sleeve was exposed to actinic light in a rotary, cylindrical exposure unit for 20 min, then developed with the aid of a flexographic washout agent (Nylosolv II®), dried for 2 h at 40° C. and postexposed for 15 min to UV/A and UV/C.

Measurements of the tensile stress were carried out with different pieces of the layer (triple determination in each case):

|  | Tensile stress [%] (Mean value of three measurements) |
| --- | --- |
| Full area without gap | 260% |
| Full area with gap (right) | 280% |
| Full area with gap (middle) | 279% |
| Full area with gap (left) | 281% |

Example 4

The procedure was as described under example 3, except that the flexographic printing element from example 2 was used.

Comparative examples 3 and 4

The procedure was as in example 3, except that the flexographic printing elements from comparative examples 1 and 2 were used.

Printing Tests

Printing tests were carried out using the cylindrical flexographic printing plates obtained from the experiments and comparative experiments.

Printing press: W&H (Windmöller and Hölscher), printing speed: 150 m/min, print medium: PE film In the examples according to the invention, a four-color print did not show a gap either in the individual color separations or in the overprinting of all colors, whereas the gap was still visible in the case of the comparative experiments.

The results are summarized in table 1.

TABLE 1

Results of the experiments and comparative experiments

| Flexographic printing plate No. | Produced from flexographic printing element No. | Comment |
|---|---|---|
| Example 3 | Example 1 | Uniform continuous motif, no gap visible in the printed image |
| Example 4 | Example 2 | Uniform continuous motif, no gap visible in the printed image |
| Comparative example 3 | Comparative example 1 | Slight defects in the printed image |
| Comparative example 4 | Comparative example 2 | Substantial defects in the printed image |

The examples and comparative examples show that sleeves with outstanding quality are obtained by means of the process according to the invention.

Instead of the entire sleeve being subjected to a thermal load, in each case only small regions are subjected to said load while the other regions are able to cool again or are not heated at all.

The measurement of the tensile stress of samples of the crosslinked layer in the region of the gap closure and without a gap show that the tensile stress in the region of the gap is even better than in regions without a gap.

The gap is no longer visible in the printed image. Defects in the printed image due to unevenness of the printing plate are no longer observed.

We claim:

1. A process comprising providing a layer composite comprising a layer of photopolymerizable material and a removable substrate film disposed on one side of the layer of photopolymerizable material, wherein the photopolymerizable material comprises an elastomeric binder, an ethylenically unsaturated monomer and a photoinitiator; and
    (a) miter-cutting two edges of the layer composite to be joined, to form two miter-cut ends;
    (b) providing a hollow cylinder on a rotatably mounted support cylinder, wherein the hollow cylinder has an outer surface and is in a temporarily locked position relative to the support cylinder;
    (c) applying an adhesion-promoting layer to the outer surface of the hollow cylinder wherein said adhesion-promoting layer comprises a double-sided adhesive film which has two miter-cutting edges, is sized to the dimensions of the hollow cylinder and is joined at the two miter-cut edges;
    (d) applying the layer composite to the hollow cylinder bearing the adhesive-promoting layer, wherein the layer composite is disposed on the hollow cylinder such that the removable substrate film faces away from the hollow cylinder and the two miter-cut ends lie substantially one on top of the other, but not overlapping;
    (e) removing the substrate film from the layer of photopolymerizable material to provide an exposed surface of the layer of photopolymerizable material;
    (f) contacting the exposed surface of the layer of photopolymerizable material with a rotating calender roll with heating to join the two miter-cut edges and form a processed hollow cylinder, wherein heating comprises a locally-acting heat source moved in an axial direction relative to the hollow cylinder along the entire width of the layer of photopolymerizable material such that the exposed surface is heated; and
    (g) removing the processed hollow cylinder from the support cylinder.

2. The process according to claim 1, wherein the locally-acting heat source comprises a warm gas stream.

3. The process according to claim 2, wherein the adhesive film has a static shear strength of at least 3 h at 70° C.

4. The process according to claim 1, wherein the adhesive film has a static shear strength of at least 3 h at 70° C.

5. The process according to claim 1, wherein the layer composite further comprises a second removable film disposed on a surface of the layer of photopolymerizable material opposing the surface bearing the removable substrate film.

6. The process according to claim 1, wherein the layer of photopolymerizable material is preexposed to actinic light from a side of the layer not bearing the removable substrate film.

7. The process according to claim 6, wherein the layer is preexposed to actinic light prior to miter-cutting.

8. The process according to claim 1, wherein the rotating calender roll is rotated such that the hollow cylinder rotates in a direction of increasing photopolymerizable material thickness at the miter-cut edge lying substantially on top of the other miter-cut edge.

9. The process according to claim 1, wherein a temperature of the exposed surface of the layer of photopolymerizable material during contacting with the rotatable calender roll is 80 to 100° C.

10. The process according to claim 1, wherein the support cylinder comprises an air cylinder.

11. The process according to claim 1, further comprising applying a digitally imageable layer to the exposed surface of the layer of photopolymerizable material.

12. The process according to claim 11, wherein the digitally imageable layer comprises at least one selected from the group consisting of IR-ablative layers, inkjet layers, thermographically inscribable layers, and combinations thereof.

* * * * *